(12) United States Patent
Srisupun et al.

(10) Patent No.: US 8,662,554 B1
(45) Date of Patent: Mar. 4, 2014

(54) VACUUM PICK-UP END EFFECTER TO PICK AND PLACE A COMPONENT IN A MANUFACTURING PROCESS

(75) Inventors: Jakkapong Srisupun, Thanyaburi (TH); Somchai Laksanasittiphan, Thonburi (TH); Komgrit Sungkhaphong, Klongsaamwa (TH)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/331,960

(22) Filed: Dec. 20, 2011

(51) Int. Cl.
*B25J 15/06* (2006.01)
(52) U.S. Cl.
USPC ............... 294/186; 294/183; 269/20; 269/21
(58) Field of Classification Search
USPC ............ 294/183, 64.2, 186; 269/20, 21, 903; 414/737; 901/40
See application file for complete search history.

(56) References Cited

U.S. PATENT DOCUMENTS

| | | | |
|---|---|---|---|
| 4,557,514 A | 12/1985 | Cushman et al. | |
| 4,903,717 A * | 2/1990 | Sumnitsch | 134/99.1 |
| 5,207,465 A | 5/1993 | Rich | |
| 5,470,420 A * | 11/1995 | Yokajty | 156/566 |
| 5,915,915 A | 6/1999 | Allen et al. | |
| 6,139,078 A | 10/2000 | Bodiker, II et al. | |
| 6,163,950 A | 12/2000 | Bodiker, II et al. | |
| 6,336,266 B1 * | 1/2002 | Kobayashi et al. | 29/741 |
| 6,439,559 B1 * | 8/2002 | Kinnard et al. | 269/21 |
| 6,663,092 B2 * | 12/2003 | Igarashi et al. | 269/21 |
| 7,281,741 B2 | 10/2007 | Woodruff et al. | |
| 7,409,812 B2 | 8/2008 | Gilmore et al. | |
| 2001/0040327 A1 * | 11/2001 | Kashiwazaki et al. | 269/21 |

* cited by examiner

*Primary Examiner* — Stephen Vu

(57) ABSTRACT

Disclosed is a vacuum pick-up end effecter to pick and place a component in a manufacturing process. The vacuum pick-up end effecter may comprise: a vacuum path to provide a vacuum flow to pick-up the component; and a pin moveably mounted within the vacuum pick-up end effecter. When the component is picked-up by the vacuum flow, the pin abuts against the component and is moved to a first position and, when the vacuum flow is cut-off to place the component, the pin moves to a second position and pushes against the component to aid in releasing the component.

16 Claims, 3 Drawing Sheets

VACUUM PICK-UP END EFFECTER TO PICK AND PLACE A COMPONENT IN A MANUFACTURING PROCESS

BACKGROUND

During the manufacturing of mechanical devices, electromechanical devices, and electrical devices, a vacuum pick-up end effecter is often used to pick and place components into the device being manufactured.

One example of a device that is often manufactured utilizing a vacuum pick-up end effecter is a hard disk drive (HDD). HDDs typically employ a moveable head actuator to frequently access large amounts of data stored on a disk. An HDD typically includes a head disk assembly (HDA) including at least one magnetic disk, a disk clamp and a disk fastener to mount the disk to a spindle motor that rapidly rotates the disk, and a head stack assembly (HSA) that includes a moveable actuator arm and a head gimbal assembly (HGA) with a moveable transducer head for reading and writing data from and to the disk. The HSA forms part of a servo control system that positions the moveable head over a particular track on the disk to read or write information from and to that track. During the manufacturing of a disk drive, a vacuum pick-up end effecter may be utilized to pick and place components into the disk drive being manufactured, such as, latches, ramps, disks, spindle motors, disk clamps, and various other HDA, HSA, and HGA components.

As devices become smaller and smaller, their various components also become smaller and smaller, such that vacuum pick-up end effecters to manufacture these devices need to be updated to effectively accommodate these smaller and lighter weight components. This is especially true in high technology manufacturing for such devices as computers, disk drives, wireless devices, cell phones, etc., which are increasing becoming smaller and smaller. Unfortunately, currently utilized vacuum pick-up end effecters are not effectively picking and placing these smaller and lighter weight components in device manufacturing such that: additional time is being added to the manufacturing process to fix errors, many devices are not being successfully assembled resulting in lower yield, and costs in the manufacturing process are significantly increasing. Accordingly, more efficient techniques for vacuum pick-up end effecters are sought after.

DETAILED DESCRIPTION

Figure 1:
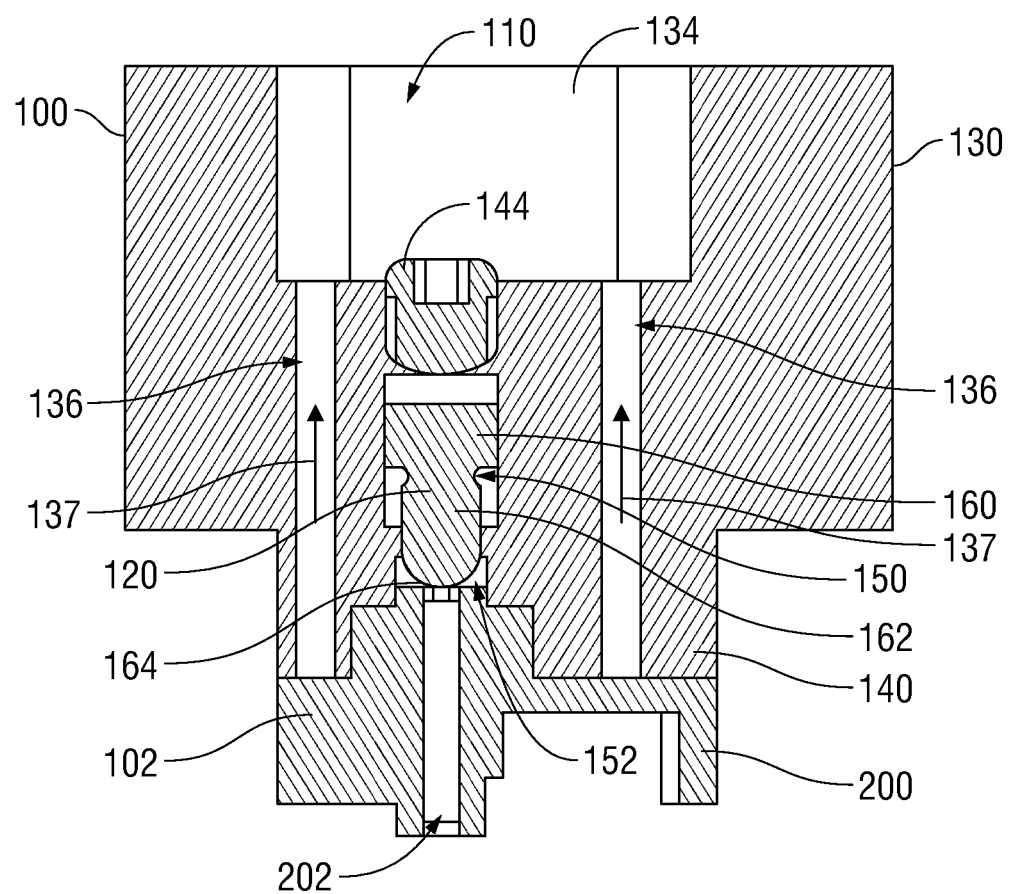
FIG. 1 is a cross-sectional view of a vacuum pick-up end effecter that may be used to pick and place a component in a manufacturing process, according to one embodiment of the invention.
Figure 2:
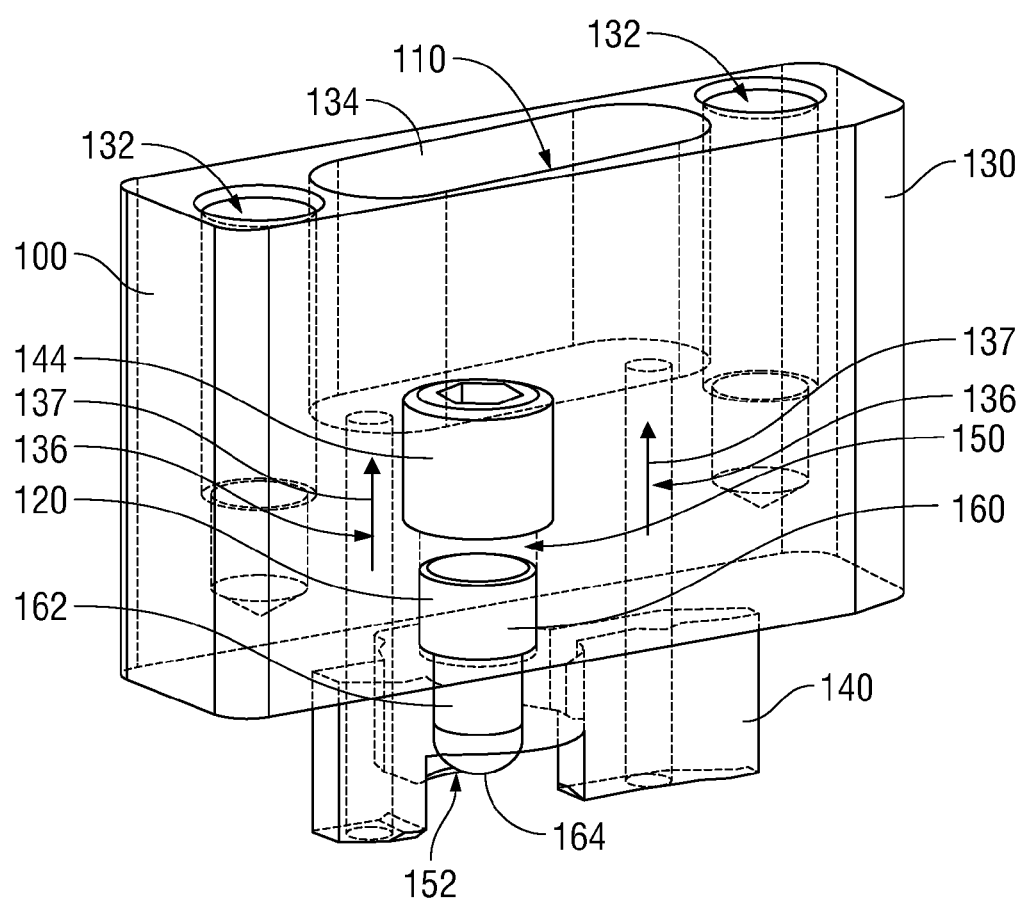
FIG. 2 is an isometric view of the vacuum pick-up end effecter, according to one embodiment of the invention.

FIG. 1 is a cross-sectional view of a vacuum pick-up end effecter 100 that may be used to pick and place a component 102 in a manufacturing process, according to one embodiment of the invention. Additional reference may also be made to FIG. 2 which is an isometric view of the vacuum pick-up end effecter 100, according to one embodiment of the invention. Vacuum pick-up end effecter 100 may include a vacuum path (e.g., see vacuum paths 136) to provide a vacuum flow 137 to pick up the component 102.

A pin 120 may be moveably mounted within vacuum pick-up end effecter 100 such that when component 102 is picked-up by vacuum flow 137, pin 120 abuts against component 102 and is moved to a first position, as shown in FIG. 1. On the other hand, when the vacuum flow is cut-off to place the component 102 in a device under assembly, pin 120 moves to a second position and pushes against the component 102 to aid in releasing or placing the component (e.g., see FIG. 3, as will be described in more detail later). For example, pin 120 may be slideably mounted within vacuum pick-up end effecter 100.

As an example of a vacuum pick-up end effecter, a top portion 130 of the vacuum pick-up end effecter 100 may be approximately rectangular-shaped and may include a pair of opposed and aligned cylindrical openings 132 that accept appropriate fasteners (e.g., screws, rivets, pins, bolts, etc.) to connect the vacuum pick-up end effecter 100 to a vacuum source (not shown). The vacuum source provides vacuum flow through an approximately oval-shaped opening 110 formed in a oval-shaped cavity 134 of the top portion 130 of vacuum pick-up end effecter 100 in order to provide vacuum flow 137 through a pair of opposed and aligned cylindrical vacuum paths 136 that are formed and extend through a smaller approximately rectangular-shaped bottom portion 140 of the vacuum pick-up end effecter 100 to provide a direct vacuum flow 137 to pick up the component 102.

A cylindrical plug 144 may be mounted within the vacuum pick-up end effecter 100 partially in the oval-shaped cavity 134 and above and adjacent to pin 120 to prevent movement of pin 120 and to prevent vacuum force from being applied to pin 120. Pin 120 may be moveably mounted for sliding up and down in a pin cavity 150 located between plug 144 and a bottom opening 152 of the vacuum pick-up end effecter 100 where pin 120 can abut against a component 102 and push against the component 102 to aid in releasing the component 102.

As an example, pin 120 may include a circular upper portion 160 and cylindrical lower portion 162 having a rounded portion 164 that may abut against the component 102 that is to be picked up and placed. Pin 120 may be a metallic material, such as, stainless steel. However, it should be appreciated that any type of material may be utilized. In particular, pin 120 may be weighted to ensure the proper release of the component 102 in the manufacturing process. For example, pin 102 may be weighted such that it is heavier than the component 102. As one particular example, pin 120 may be weighted such that it is at least two times heavier than the weight of the component 102. However, it should be appreciated that any proper weighting of the pin 102 may be selected to enhance the release of component 102 in the placing aspect of the manufacturing process. Further, although a pin 120 has been given as an example of a moveable weight, it should be appreciated that a wide variety of different types of structures and components may be used as a moveable weight.

As an example, in one embodiment, component 102 may be a disk drive component that is used in a disk drive manufacturing process. As particularly shown in FIGS. 1 and 3, the disk drive component may be a latch component 200. As is known in the art, a latch component 200 may be an approximately L-shaped component having an opening 202 that may be mounted with a screw to a disk drive. The latch component 200 may be used to prevent the head stack assembly of the disk drive from leaving the ramp of the disk drive and serves as a crash stop. However, many different types of disk drive components may be picked and placed during the manufacturing of a disk drive utilizing the vacuum pick-up end effecter 100, such as: ramps, disks, spindle motors, disk clamps, and various other HDA, HSA, and HGA components. Vacuum pick-up end effecters are often utilized to mount disk drive components into the disk drive during disk drive manufacturing. Unfortunately, presently utilized vacuum pick-up end effecters in disk drive manufacturing have been found not to release light weight disk drive components quickly enough and these components tend to stay attached to the end effecter for too long a period of time such that they are not placed at the proper position or not at all. This causes errors in the disk drive manufacturing process.

Figure 3:
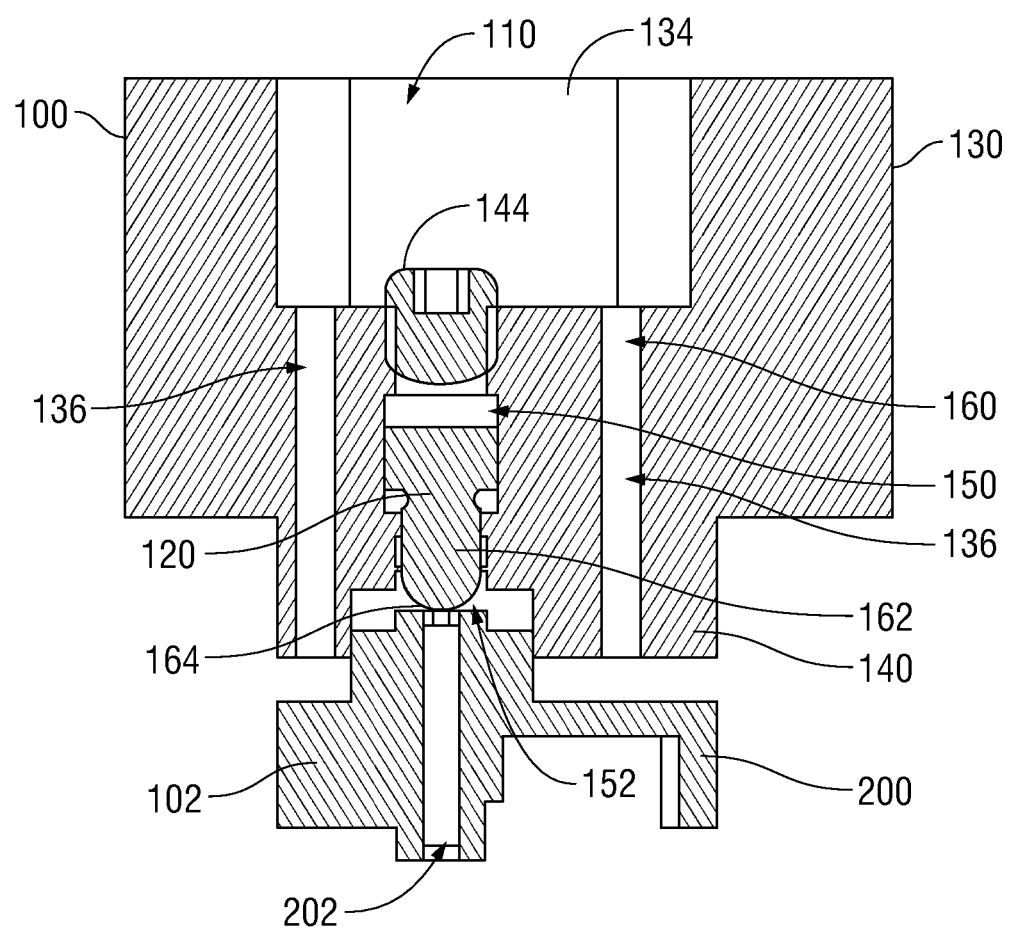
FIG. 3 is a cross-sectional view of the vacuum pick-up end effecter releasing a component, according to one embodiment of the invention.

Embodiments of the present invention by utilizing a pin 120 moveably mounted within the vacuum pick-up end effecter 100 may be utilized to ensure the release or placement of light weight components in a quick period of time to ensure that they are released at the proper position. Although FIGS. 1 and 3 show a disk drive latch component 200, it should be appreciated that any type of disk drive component, such as, a ramp, a disk clamp, a disk, a spindle motor, or various other HDA, HSA, and HGA components may be utilized with vacuum pick-up end effecter 100. Further, embodiments of the invention for a vacuum pick-up end effecter 100 utilizing a pin 120 may be utilized in any type of manufacturing process for any type of component 102 used in the assembly of any type of mechanical, electromechanical, or electrical device.

With reference to FIG. 1, when component 102 is picked-up by vacuum flow 137 through vacuum paths 136 supplied by the vacuum pick-up end effecter 100, the bottom portion 164 of pin 120 abuts against component 102 and pin 120 is moved to a first position. For example, in the latch component 200 illustration, the top U-shaped portion of the latch component 200 mates against the bottom portion 140 of the vacuum pick-up end effecter 100 and the bottom portion 164 of pin 102 abuts against the top of the U-shaped latch 200 in the first position. With reference to FIG. 3, when the vacuum flow 137 is cut-off, to place the component 102, pin 120 moves to a second position and pushes against component 102 to aid in releasing the component for use in manufacturing the device. For example, in the latch component 200 illustration, pin 120 moves against and pushes the top of the U-shaped latch 200 to aid in releasing the latch component 200 from the vacuum pick-up end effecter 100 for placing the latch component 200 in the disk drive for the assembly of the disk drive.

It should be noted that when the vacuum flow 137 is cut-off, because there is very little area for air to flow into the vacuum paths 136 (e.g., as shown in FIG. 1, component 102 blocks the entrances of vacuum paths 136), the vacuum pressure inside the vacuum paths 136 tends to be lower than the atmosphere pressure such that the difference between the pressure outside the vacuum pick-up end effecter 100 and inside the vacuum pick-up end effecter 100 creates a residual lift force even though the vacuum flows 137 have been turned off. The residual lift force tends to be more than the weight of the component. However, the extra weight applied by pin 120 moving to the second position (FIG. 3) adds extra weight and pushes against component 102 to aid in releasing and placing component 102. Thus, the extra weight applied by pin 120 overcomes the residual lift force and releases the component 102 from the vacuum pick-up end effecter 100 in a quicker fashion. As previously described, pin 120 may be selected to have a heavier weight than the component 102, such as, at least two times greater than the weight of the component, to aid in the release of component. However, any particular pin weight may be selected to best accomplish releasing the component.

By adding extra weight via a moveable pin 120, the vacuum pick-up end effecter 100 more effectively releases smaller lighter weight components 102. The pin 120 aids in overcoming the residual lift force that occurs even after the vacuum pressure is turned off such that smaller lighter weight components 102 can be released or placed immediately for assembly. In this way, smaller lighter weight components 102 may be placed for assembly in a more predictable fashion thereby saving time, increasing yield, and lowering costs during manufacturing.

Although an example of a latch component 200 has been utilized as an example of a component for use with a vacuum pick-up end effecter 100 having a pin 120 moveably mounted within the vacuum pick-up end effecter, it should be appreciated that the vacuum pick-up end effecter 100 may be utilized with any type of disk drive component. Further, it should be appreciated that the vacuum pick-up end effecter 100 utilizing a moveable pin 120 within the vacuum pick-up end effecter 100 may be utilized for picking and placing components 102 in any type of manufacturing process for any type of mechanical, electromechanical, or electrical device. For example, such devices as computers, wireless devices, cell phones, etc., are increasing utilizing smaller and lighter weight components that may be effectively placed in the manufacturing process utilizing the vacuum pick-up end effecter 100.

While embodiments of the invention and their various mechanical and functional components have been described in particular embodiments, it should be appreciated that the embodiments can be implemented with a wide variety of differing mechanical, electromechanical, and electrical components, and combinations thereof. Further, although the previous embodiments have been described as being employed for use with a disk drive component, these embodiments may be implemented with numerous other types of components for manufacturing any type of mechanical, electromechanical, or electrical device.

What is claimed is:

1. A vacuum pick-up end effecter to pick and place a disk drive component in a disk drive manufacturing process comprising:
   a vacuum path to provide a vacuum flow to pick-up the disk drive component; and
   a pin moveably mounted within the vacuum pick-up end effecter;
   wherein, when the disk drive component is picked-up by the vacuum flow, the pin abuts against the disk drive component and is moved to a first position and, when the vacuum flow is cut-off to place the disk drive component, the pin moves to a second position and pushes against the disk drive component to aid in releasing the disk drive component.

2. The vacuum pick-up end effecter of claim 1, wherein the weight of the pin is greater than the weight of the disk drive component.

3. The vacuum pick-up end effecter of claim 1, wherein the weight of the pin is at least two times greater than the weight of the disk drive component.

4. The vacuum pick-up end effecter of claim 1, wherein the pin comprises a metallic material.

5. The vacuum pick-up end effecter of claim 4, wherein the metallic material comprises stainless steel.

6. The vacuum pick-up end effecter of claim 1, wherein the pin comprises a rounded portion that abuts against the disk drive component.

7. The vacuum pick-up end effecter of claim 1, further comprising a plug mounted within the vacuum pick-up end effecter adjacent to the pin to prevent movement of the pin.

8. The vacuum pick-up end effecter of claim 1, wherein the disk drive component is a latch.

9. A method to pick and place a disk drive component in a disk drive manufacturing process comprising:
   providing a vacuum flow to pick-up the disk drive component; and
   providing a pin to move relative to the disk drive component;
   wherein, when the disk drive component is picked-up by the vacuum flow, the pin abuts against the disk drive component and is moved to a first position and, when the vacuum flow is cut-off to place the disk drive component, the pin moves to a second position and pushes against the disk drive component to aid in releasing the disk drive component.

10. The method of claim 9, wherein the weight of the pin is greater than the weight of the disk drive component.

11. The method of claim 9, wherein the weight of the pin is at least two times greater than the weight of the disk drive component.

12. The method of claim 9, wherein the pin comprises a metallic material.

13. The method of claim 12, wherein the metallic material comprises stainless steel.

14. The method of claim 9, wherein the pin comprises a rounded portion that abuts against the disk drive component.

15. The method of claim 9, further comprising mounting a plug adjacent to the pin to prevent movement of the pin.

16. The method of claim 9, wherein the disk drive component is a latch.

* * * * *